United States Patent
Tamba et al.

[11] Patent Number: 5,920,119
[45] Date of Patent: Jul. 6, 1999

[54] POWER SEMICONDUCTOR MODULE EMPLOYING METAL BASED MOLDED CASE AND SCREW FASTENING TYPE TERMINALS FOR HIGH RELIABILITY

[75] Inventors: Akihiro Tamba; Kazuji Yamada; Ruichi Saito, all of Hitachi; Tatsuya Shigemura, Hitachinaka; Yukio Sonobe, Hitachiota; Masataka Sasaki, Hitachi; Kazuhiro Suzuki, Mito, all of Japan

[73] Assignee: Hitachi, Ltd., Tokyo, Japan

[21] Appl. No.: 08/802,988

[22] Filed: Feb. 21, 1997

[30] Foreign Application Priority Data

Feb. 22, 1996 [JP] Japan .................................. 8-034592

[51] Int. Cl.⁶ .......................... H01L 23/12; H01L 23/48; H01L 23/08
[52] U.S. Cl. .................. 257/718; 257/719; 257/727; 257/726; 257/723; 257/712; 257/693; 257/728; 257/678
[58] Field of Search ................................ 257/728, 713, 257/712, 724, 717, 726, 691, 690, 787, 723, 678, 687, 693, 727, 719, 718; 361/386, 736, 707; 174/52, 2

[56] References Cited

U.S. PATENT DOCUMENTS

| | | | |
|---|---|---|---|
| 4,639,759 | 1/1987 | Neidig et al. | 257/724 |
| 5,144,155 | 9/1992 | Maenishi et al. | 307/254 |
| 5,264,985 | 11/1993 | Sako et al. | 361/361 |
| 5,361,189 | 11/1994 | Miyashita | 361/807 |
| 5,373,105 | 12/1994 | Nagaune et al. | 257/693 |
| 5,381,042 | 1/1995 | Lerner et al. | 257/712 |
| 5,424,579 | 6/1995 | Arai et al. | 257/690 |
| 5,430,326 | 7/1995 | Miyashita | 257/691 |
| 5,471,089 | 11/1995 | Nagatomo et al. | 257/691 |
| 5,519,252 | 5/1996 | Soyano et al. | 257/690 |
| 5,621,243 | 4/1997 | Baba et al. | 257/712 |
| 5,625,536 | 4/1997 | Soyano et al. | 361/736 |
| 5,646,445 | 7/1997 | Masumoto et al. | 257/712 |

FOREIGN PATENT DOCUMENTS

| | | | |
|---|---|---|---|
| 0251260 | 1/1988 | European Pat. Off. | |
| 0591900 | 4/1994 | European Pat. Off. | |
| 59-82755 | 5/1984 | Japan | 257/712 |
| 4-97554 | 3/1992 | Japan | 257/712 |
| 6-188363 | 7/1994 | Japan | 257/712 |
| A-6-224314 | 8/1994 | Japan | |
| A-7-263621 | 10/1995 | Japan | |

OTHER PUBLICATIONS

Patent Abstracts of Japan, vol. 014, No. 142 (E–0904), Mar. 16, 1990.
Patent Abstracts of Japan, vol. 007, No. 222 (E–201), Oct. 4, 1983.

*Primary Examiner*—Alexander Oscar Williams
*Attorney, Agent, or Firm*—Antonelli, Terry, Stout & Kraus, LLP

[57] ABSTRACT

A power semiconductor module having a power circuit unit; a metal base for sealing the bottom of the module; an insulation substrate for electrically insulating the metal base from the power circuit unit; external input and output terminals connected to the power circuit unit; a resin case in which the external input and output terminals are inserted by integral molding; and a resin encapsulant material has been improved substantially in its reliability through provision of a nut integrally molded with the resin case for fastening the external input and output terminals with a screw; a metal base inserted in the resin case by integral molding; and a recess to receive the end of the screw located immediately below the nut, the recess extending without penetrating the resin case, and the metal base extending to an area below the recess.

13 Claims, 8 Drawing Sheets

A-A' CROSS-SECTION

A-A' CROSS-SECTION

FIG. 7 (c)

B-B' CROSS-SECTION

POWER SEMICONDUCTOR MODULE EMPLOYING METAL BASED MOLDED CASE AND SCREW FASTENING TYPE TERMINALS FOR HIGH RELIABILITY

BACKGROUND OF THE INVENTION

The present invention relates to a power semiconductor module for use in a power conversion apparatus, such as an inverter or the like, and in particular, it relates to a highly reliable module structure of an insulated gate bipolar transistor (IGBT) module.

Figure 2:
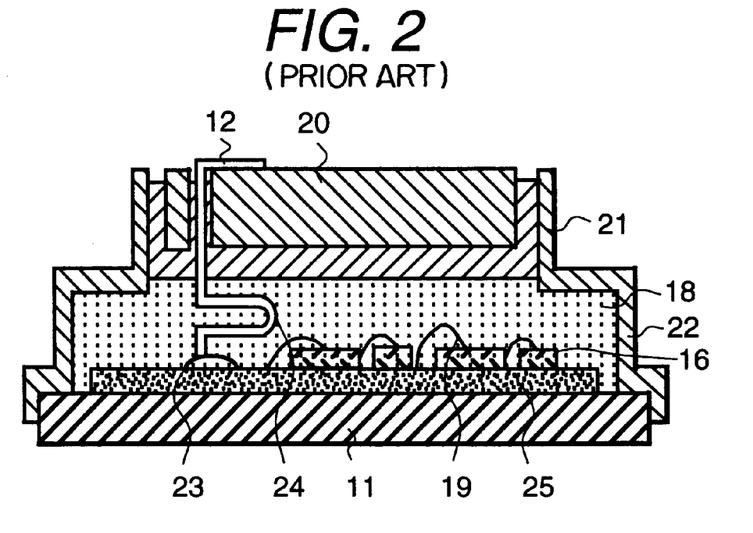
FIG. 2 is a diagram in cross-sectional view of a prior art power semiconductor module.

A conventional IGBT module structure is shown in FIG. 2. As seen in FIG. 2, a ceramics substrate 25 is soldered on a Cu base 11, and the substrate 25 has a Si chip 16 (i.e., IGBT, free-wheeling diode (FWD)) mounted thereon. An electric connection between a main terminal 12 or a control terminal (not shown) with the Si chip 16 is provided by soldering the above-mentioned terminals to the ceramics substrate 25. These terminals are embedded in a cap of the module, which is made of resin and is depicted as terminal block 20, which is located in the upper portion of the module.

Figure 3:
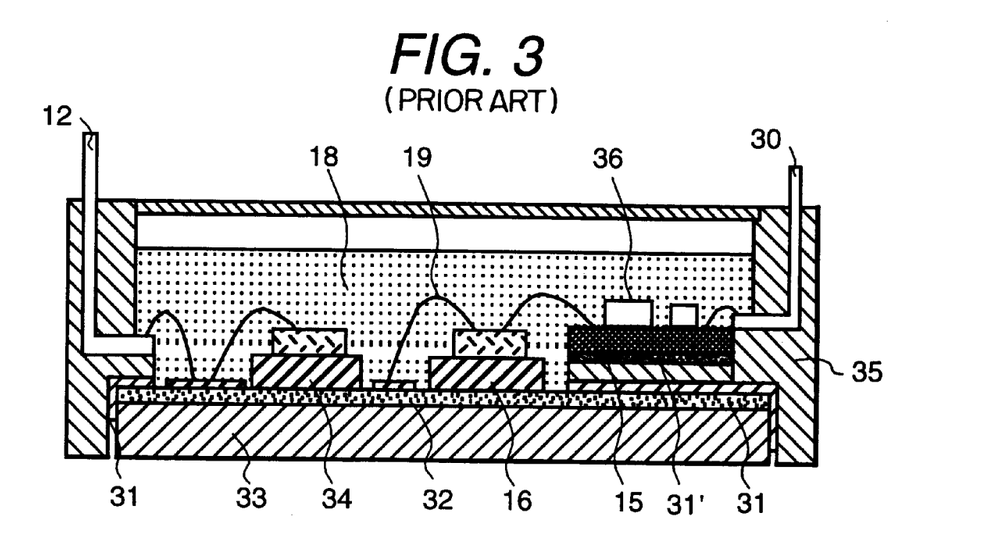
FIG. 3 is a diagram in cross-sectional view of another prior art power semiconductor module using a conventional inserted case.

In JP-A No. 7-263621, there is disclosed a module structure using a so-called terminal-inserted case 35, where main terminal 12 and control terminal 30 are inserted in the case of the module, as shown in FIG. 3. In this module structure, Si chips 16, including an IGBT and a FWD, are soldered on a copper plate for reducing the thermal resistance (i.e., heat spreader 34), and the heat spreader 34 is soldered on a surface of an Al metal core printed wiring board 33, which is prepared by coating a resin 32 on a surface of an Al substrate for electrically insulating the chips from the substrate. Then, the Al metal core printed wiring board 33, which supports the thermal spreader 34, IGBT, FWD and the like, is bonded to a terminal-inserted case 35 using a thermosetting silicone adhesive 31. For this module structure, using the terminal-inserted case 35 of FIG. 3, there are two ways for electrically connecting its terminals with the chips. One is by wire bonding alone, as shown in FIG. 3, and the other is by soldering the terminals to the ceramics substrate.

Figure 4:
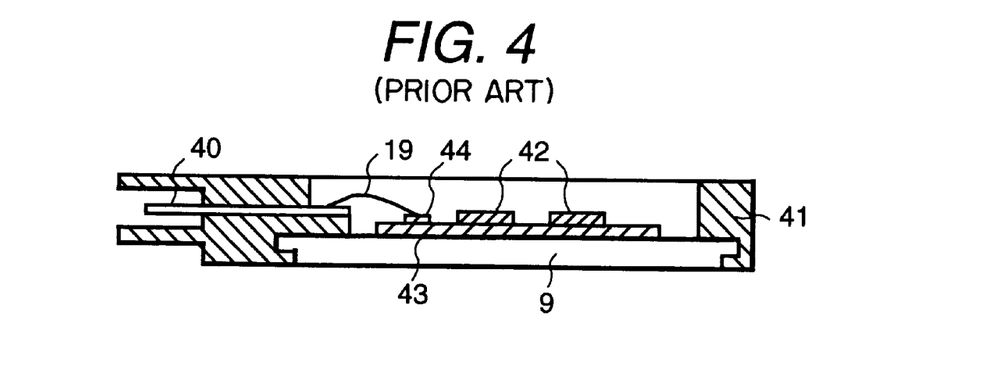
FIG. 4 is a diagram in cross-sectional view of still another prior art power semiconductor module using a conventional metal base inserted module case.

With reference to FIG. 4, JP-A No. 6-224314 discloses another semiconductor device prepared by encasing a metal base 9 in a module case 41 in such a manner that the metal base 9 and external input and/or output terminals 40 are molded so as to be integral with the module case 41. In FIG. 4, electronics components 42 are soldered on a surface of a thick film circuit board 43, and input and/or output terminal 44 on the surface of the thick film circuit board 43 is electrically connected to an external connection terminal using a metal wire 19.

The prior art semiconductor devices referred to above have the following inherent problems which deteriorate the reliability of the module.

In the structure of FIG. 2 using the terminal block 20, main terminal 12, which is soldered to a copper foil on the surface of the ceramics substrate 25, has a substantially vertical orientation. Since there exists a large difference in the coefficient of linear expansion between main terminal 12 made of a metal and that of the ceramics substrate 25, the solder 23 connecting the ceramics substrate 25 and the main terminal 12 is subjected to a large stress due to a repeated heat cycle of heating and cooling of the module. The mechanical strength of the solder 23 deteriorates due to application of this stress, consequently allowing a crack to propagate therein and thereby causing a failure of the connection. In order to reduce the L occurrence of such an adverse phenomenon, a bending portion 24 is provided in the main terminal 12, as shown in FIG. 2, so as to absorb the stress. However, the provision of this bending portion 24 results in an increase in the length of the main terminal 12, thereby substantially increasing its inductance, with the result that the performance of the module is deteriorated. Namely, according to the module structure of FIG. 2, it is difficult to achieve a high reliability and a high performance for the module at the same time.

FIG. 3 illustrates a module structure using the terminals-inserted case 35 in which electrical connection is provided solely by wire bonding. The advantages of using the terminals-inserted case reside in the fact that it can eliminate the terminal block 20 of FIG. 2, thereby reducing its manufacturing cost, and it can avoid deterioration of the reliability of the solder due to the heat cycle described above at the same time. However, the bonding of Al metal core printed wiring board 33 with the terminals-inserted case 35 must be done using a thermoset adhesive because a room temperature setting adhesive, which has a relatively low reliability, cannot be used in a stringent environment subject to a heat cycle of heating and cooling where IGBT modules are used. Further, even though a highly reliable room temperature adhesive may be developed in the future, the problem associated with degassing of the adhesive during the process of curing the encapsulating gel or resin at high temperatures, which is inevitable to a power semiconductor manufacture, will still remain, thereby causing an obstruction to the curing of gel 18.

Use of a thermosetting silicone resin adhesive 31 for bonding the terminals-inserted case 35 and the Al metal core printed wiring board 33 has resulted in a highly reliable bonding therebetween. However, since wire bonding must be done after completion of bonding between the inserted-case 35 and the Al metal core printed wiring board 33, there arises a problem in that an electrode pad for wire bonding is contaminated by silicone oil and the like which is produced at the time of the curing of the silicone resin adhesive 31. This contamination reduces the adhesive strength of the wire bonding, thereby decreasing the reliability of the module. Namely, the module construction of FIG. 3, although it eliminates the problem of deterioration of the solder 23 for connecting to the terminal of FIG. 2, is associated essentially with another problem in that the bonding strength between the wire and the pad is lowered due to contamination, thereby lowering the reliability of the module. This problem occurs irrespective of whether the wire bonding is carried out by an ultrasonic bonding method, a thermo-compression method or a combined ultrasonic thermo-compression method.

In the case of the prior art arrangement of FIG. 4 in which the metal base 9 is molded integral with the terminals-inserted case 41, the above-mentioned two problems of the deterioration of the solder and the contamination of the bonding pad due to use of the thermosetting resin adhesive have been solved. However, when the module construction of FIG. 4 is applied to a power semiconductor module which requires a withstand voltage over several hundred volts and allows a large current to flow therethrough, it becomes essential to encapsulate the module with an encapsulant, such as a gel, epoxy resin or the like, to fasten the terminal connected to its power circuit to the module with a screw so as to ensure the reliability of the connection, and to ensure that the above-mentioned screw will have a sufficient insulation and distance from the surrounding electrical elements to ensure the reliability of the module. However, according to the prior art structure disclosed in FIG. 4, there are still problems, such as gel which is poured as an encapsulant leaking through a peripheral portion of the module where the metal base is inserted into the module case and an external input and/or output terminal 40 not being able to be fastened sufficiently with a screw.

SUMMARY OF THE INVENTION

The object of the present invention is to provide for a power semiconductor module which is simple in construction, has a highly reliable encapsulation structure and is immune to electromagnetic interference in order to provide a large current highly reliable power semiconductor module at a reduced production cost.

The above-mentioned object of the invention can be accomplished by providing a module having a metal base inserted case formed by integral molding, which solves the problems of occurrence of cracks in the solder and of deterioration of the module reliability due to the use of a thermoset resin adhesive, thereby eliminating the leakage of a gel or hard resin which has been poured into the module for encapsulation thereof, and further which features an arrangement for fastening the main terminal to the module with a screw.

A power semiconductor module according to one aspect of the present invention is comprised of a power circuit unit having power semiconductor elements; a control circuit unit for controlling the power circuit unit; a metal base for sealing the bottom of the module; an insulation substrate for electrically insulating the metal base from the power circuit unit; external input and output terminals to be connected to the power circuit unit; a terminals-inserted resin case in which the external input and output terminals are molded; and a resin encapsulant, wherein the power semiconductor module further comprises an inserted nut for fastening the external input and output terminals with a screw to the module, the inserted nut being molded integral with the resin case; and a recess for the end of the screw provided below the inserted nut, which recess does not penetrate the resin case.

A power semiconductor module according to another aspect of the invention is comprised of a metal base which is molded integral with a resin case having a nut and a recess and a part of an external input/output terminal inserted therein by integral molding, and a part of the metal base extends below the recess via a portion of the resin case, and wherein a part of the external input/output terminal is disposed substantially perpendicular relative to the metal base.

A power semiconductor module according to still another aspect of the invention is comprised of a metal base which is molded integral with a resin case wherein a groove is formed in the surface of the metal base which is in contact with the resin case. This groove may be formed in two rows or more and on both surfaces of the metal base.

Figure 1:
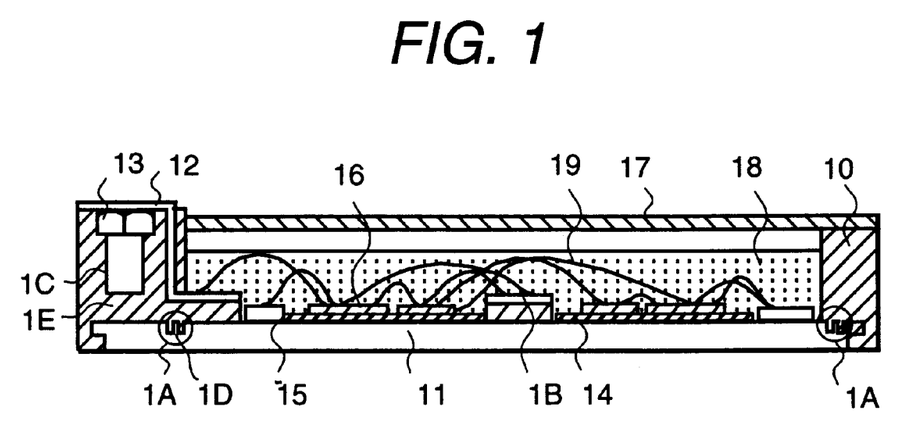
FIG. 1 is a diagram in cross-sectional view of a power semiconductor module according to one embodiment of the invention.

A power semiconductor module of the invention has a module construction which has a nut, a recess and a metal base provided in a case by integral molding and is encapsulated by gel as shown in FIG. 1. The power semiconductor module of the invention has a groove 1A formed in the surface of a metal base which is made of copper or the like in order to prevent leakage of liquid gel or hard resin prior to its curing, and wherein copper base 11, nut 13, main terminal 12 and a control terminal (not shown) are molded integral within module case 10.

The reason why nut 13 is molded integral within the module case 10 of the power semiconductor module of the invention is because, when nut 13 is inserted into the case after the completion of its molding in a conventional manner, there inevitably exists a clearance gap between the nut and the module case, which gap subsides and reduces the strength of the module case when subjected to a screw fastening torque, consequently causing a crack in the module case, thereby deteriorating the reliability of the power semiconductor module. Further, it is required for the power semiconductor module of the invention to have a recess portion 1C for the end of the screw immediately below the nut 13 and a resin portion 1E of a specified thickness to ensure electrical insulation between the recess 1C and copper base 11.

The power semiconductor module of the invention features an improved adhesion between copper base 11 and module case 10 so that the problem of gel leakage is eliminated. Further, main terminal 12 can be fastened firmly to the module case with a screw since nut 13 is inserted within the inserted module case by integral molding, and in addition, a recess for accommodating the end of the screw is provided by recess portion 1C and an adequate insulation distance is ensured by resin portion 1E.

A power semiconductor module according to another aspect of the invention is comprised of a power circuit unit having power semiconductor elements; a control circuit unit for controlling the power circuit unit; a metal base which seals the bottom portion of the module; an insulation substrate for electrically insulating the metal base from the power circuit unit; external input and output terminals to be connected to the power circuit unit; a resin module case having the external input and output terminals inserted therein; and a resin encapsulant, wherein the power semiconductor module is further comprised of an opening in the module case for inserting a nut for fastening the external input and output terminals with a screw; a recess for accommodating the end of the screw disposed immediately below the opening, but not penetrating the resin module case, and wherein the metal base is inserted within the resin module case by integral molding.

A power semiconductor module according to still another aspect of the invention is comprised of a power circuit unit having power semiconductor elements; a control circuit unit for controlling the power circuit unit; a metal base which seals the bottom portion of the module; an insulation substrate for electrically insulating the metal base from the power circuit unit; external input and output terminals to be connected to the power circuit unit; a resin module case having the external input and output terminals inserted therein by integral molding; and a resin encapsulant, wherein the resin module case has a screw thread hole for receiving a screw for fastening the external input and output terminals; and a recess for accommodating the end of the screw below the screw thread hole, the recess being disposed so as not to penetrate the module case, and wherein the metal base is molded integral within the resin module case.

A power semiconductor module according to still another aspect of the invention is further comprised of a beam made of substantially the same resin as that of the resin module case which is disposed across approximately the center portion of the metal base, and wherein a ground wiring is formed on the beam.

A power semiconductor module according to a further aspect of the invention has an upper arm portion and a bottom arm portion of the printed circuit board, which arm portions are disposed symmetrically with respect to the beam.

A power semiconductor module according to still another aspect of the invention has source voltage wiring and ground wiring disposed approximately in parallel to each other, an output wiring is disposed approximately perpendicular to the source voltage wiring and the ground wiring, the output wiring being disposed approximately perpendicular to the printed circuit board of the control circuit unit.

A power semiconductor module according to a still further aspect of the invention has gate wiring of a power semiconductor element and reference voltage wiring of a gate voltage of the power semiconductor element disposed approximately in parallel to each other on the control circuit unit of the printed wiring board.

A power semiconductor module according to still another aspect of the invention is comprised of a power circuit unit having a power semiconductor element; a control circuit unit for controlling the power circuit unit; an insulation substrate for electrically insulating the power circuit unit from an external heat spreader and for sealing the bottom portion of the module; external input and output terminals to be connected to the power circuit unit; a resin module case having the external input and output terminals inserted therein by integral molding; and a resin encapsulant, wherein the insulation substrate is molded integral with the resin module case, and the insulation substrate contains alumina or aluminum nitride as its main component.

A power semiconductor module according to still another aspect of the invention is comprised of a power circuit unit having a power semiconductor element; a metal base for sealing the bottom portion of the module; an insulation substrate for electrically insulating the metal base and the power circuit unit; external input and output terminals to be connected to the power circuit unit; a resin module case having the external input/output terminals inserted therein by integral molding; and a resin encapsulant, wherein the power semiconductor module further comprises a nut for fastening the external input and output terminals to the resin module case with a screw, the nut being secured within the resin module case by integral molding; and a recess for accommodating the end of the screw provided below the inserted nut, the recess not penetrating through the resin module case, and wherein the metal base is molded integral within the resin module case, and a part of the metal base extends via a portion of the resin module case to the area beneath the recess portion.

A power semiconductor module according to the invention wherein bonding between the power semiconductor element and the insulation substrate, and between the insulation substrate and the metal base is provided by using a solder having a softening point or melting point (hereinafter referred to as softening point) which is lower than that of the resin which composes the module case.

A power semiconductor module according to the invention, having a nut and an external input or output terminal inserted by integral molding within a resin module case, has a feature that can improve the reliability of a screw fastening for a terminal by eliminating any clearance gap between the nut and the case, whereby the fastening strength of the screw and the terminal can be increased. Further, there is another feature in that, since the metal base as well as the nut are molded integral within the resin module case, and since a recess is formed under the inserted nut in the module case so as not to penetrate the module case and to maintain an appropriate thickness of the resin case between the recess and a portion of the metal base extending under the module case, an adequate withstand voltage is ensured therebetween. For this purpose, it is necessary for the metal base to extend to an area below the inserted nut and the recess in order to ensure the mechanical strength of the power module. Further, the beam formed across the center of the module case also helps to increase the mechanical strength of the power module.

Groove 1A formed in the surface of the metal base additionally serves to prevent the leakage of gel or hard resin prior to its curing, and operates to protect the wirings and elements in the module case from moisture and contaminants in the air.

PREFERRED EMBODIMENTS

Embodiment 1

Figure 8:
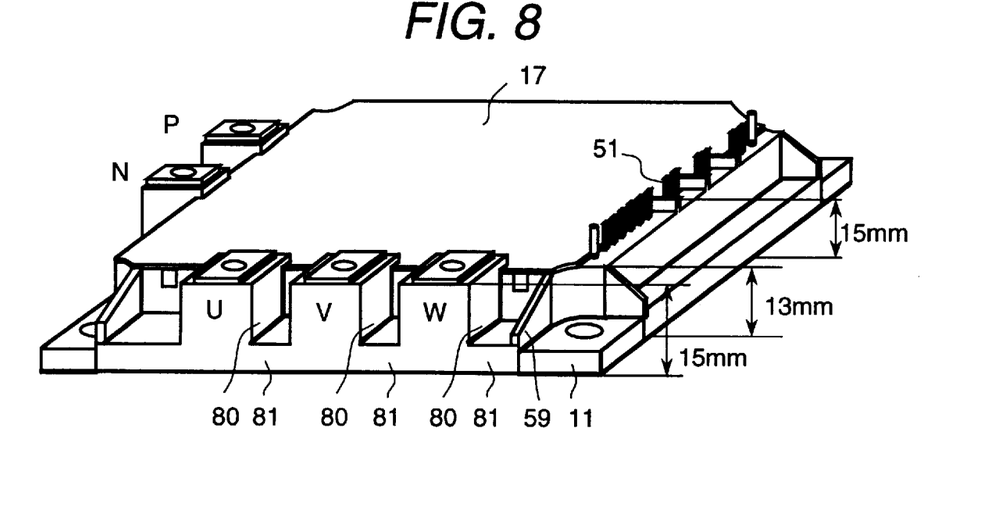
FIG. 8 is a perspective view of a power semiconductor module of the invention.

FIG. 1 is a diagrammatic cross-sectional view of a three-phase inverter module according to one embodiment of the invention. In this embodiment 1, a so-called inserted mold case is utilized, in which a copper base 11, a main terminal 12 and a nut 13 are combined by integral molding within a module case 10 using the same plastic molding die. Peripheral portions 1D of metal base 11, as seen at 1A in FIG. 1, have a stepwise structure in order to improve the adhesion between module case 10 and copper base 11. However, this stepwise structure may be eliminated if the thickness of the resin of the module case in contact with the peripheral side-wall of metal base 11 is increased in order to increase the adhesion therebetween. A recess 1C provided in the side wall of the module case is provided to accommodate the end of a screw for fastening the main terminal 12 to the module case 10, and it is essential for the nut 13 and the recess to be molded together within the module case in order to accomplish the object of the invention. In addition, this recess 1C must not be so deep as to penetrate the module case and reach the copper base 11, and so there must remain a resin portion 1E indicated in FIG. 1 to achieve a high voltage module construction. In this regard, since the copper base 11 is normally at ground potential, an adequate insulation distance must be secured between the copper base and the end of the screw, which is in contact with the main terminal 12 to which a high voltage applied. In this embodiment, the main terminal 12 rises perpendicular to the copper base 11 to ensure an adequate insulation distance therebetween, and copper base 11 extends as far as the bottom portion under the inserted nut 13 to ensure that the module will have an adequate mechanical strength. The reason why such a module construction is necessary will be described with reference to FIG. 8, which is a perspective view of the module of the invention. Generally, it is desirable for the side wall portion of the module case to have an even thickness in order to reduce stress and prevent bending thereof. On the other hand, the side wall portion of the module case in which terminals P, N, U and V are to be inserted and fastened with a screw becomes inevitably thick. In this embodiment of the invention, there is provided a space 80 between respective terminal side wall portions in order to reduce as much as possible the area having a thick side wall portion around the circumference of the module case. As a result, there is provided a portion 81 below space 80 in the circumference of the module case having a reduced thickness, which, however, reduces its strength when a screw fastening torque is applied, thereby requiring the copper base 11 to extend as far as to the portion 81 to reinforce the mechanical strength of the module.

Figure 5:
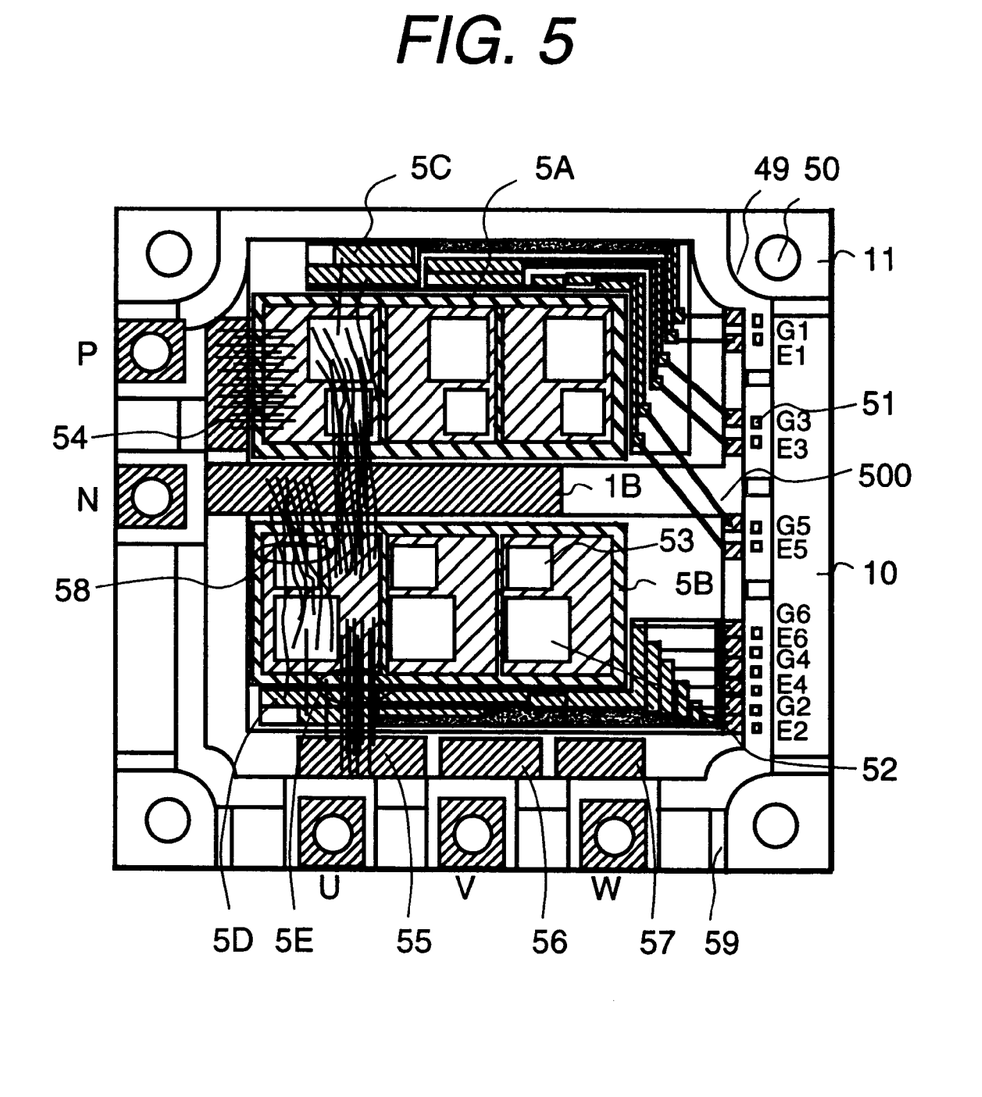
FIG. 5 is a diagrammatic plan view indicative of a power semiconductor module pattern according to the invention.

Now, grooves 1A formed in part of the surface of a copper base 11 having two rows of grooves will be described. In FIG. 5 there is depicted a pattern in plan view of a module of the invention. Module mount opening 50 is not covered with resin, and so the copper base 11 is exposed. This exposure has the purpose of avoiding a decrease in adhesion between the module and a fin which is fastened with a bolt, which, however, will be loosened if fastened with a resin coating interposed therebetween, thereby increasing its heat resistance, and consequently lowering the reliability of the module. Therefore, in a boundary portion 49 between the module case 10 and copper base 11, the module case and the copper base are bonded via one surface-to-surface contact with each other without a clamp action as provided in other peripheral portions of the module where the copper base is clamped from both surfaces thereof by a resin structure, and so the adhesion between the module case and the copper base in the boundary portion 49 is not strong. In order to improve such poor adhesion, groove 1A as indicated in FIG. 1 is required. Provision of groove 1A not only increases the surface distance or area of contact between module case 10 and copper base 11, but also improves the adhesion strength therebetween remarkably, since the protrusion 1D between two rows of grooves is clamped by the resin structure as it shrinks from both sides of the protrusion similar to the side wall portion of the metal base. By way of example, if it is intended only to extend the surface distance or area of contact between the module case and the copper base, groove 1A is not limited to that of FIG. 1, and may be comprised of a single groove, and the shape of the groove may take various forms. In this embodiment of the invention, the thickness of the copper base 11 is 3 mm, and the width and depth of groove 1A is 1 mm, respectively. Leakage of gel was observed after one hour of gel pouring in the prior art module structure of FIG. 4, however, there occurred no gel leakage from the module construction of the embodiment of the invention. Encapsulant for the module is not limited to gel, and may include thermoplastic resins, such as an epoxy resin (hard resin), polyphenylene sulfide resin (PPS), or a resin mixed with ferrite to accord with EMC.

Figure 6:
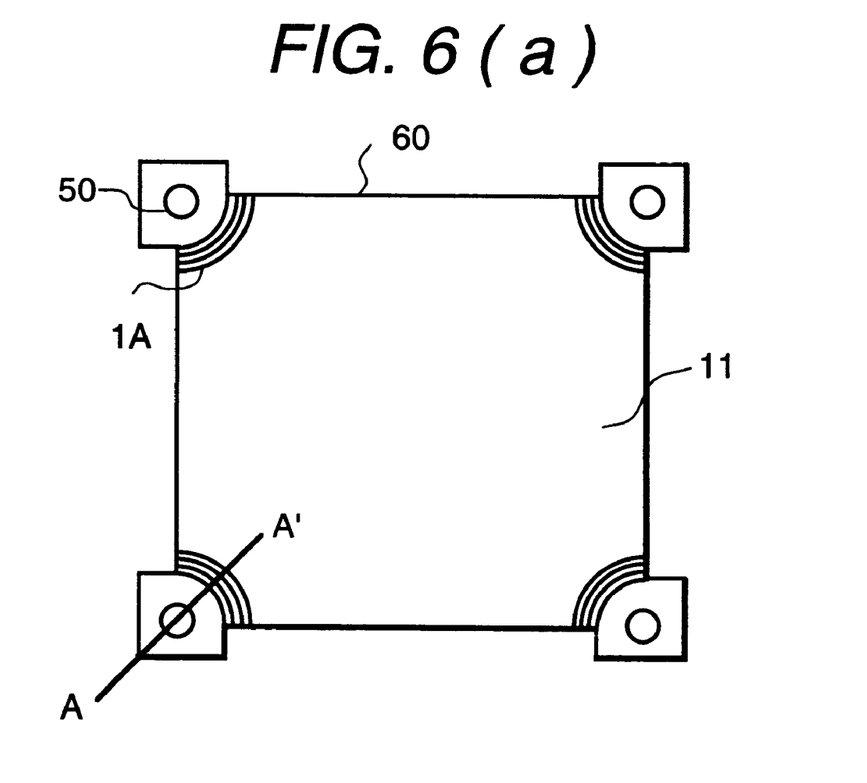
FIG. 6(a) is a diagrammatic plan view indicative of a copper base of the power semiconductor module of the invention.
FIG. 6(b) is a cross-sectional view taken along line A–A' in FIG. 6(a)

FIG. 6(*a*) is a plan view and FIG. 6(*b*) is a cross-section of a copper base 11 according to the embodiment of the invention. Side portions of the copper base 11, except for a module mount opening 50 and its vicinity, have a cut-out portion 60. This cut-out portion is provided for increasing the resin thickness along the side walls of the copper base 11 to make them as thick as possible to improve the adhesion therebetween. Further, since the resin structure embedded in the groove 1A is integral and continuous with the thick resin portion along the side walls of the copper base, the strength of the resin structure embedded in the groove is reinforced. Further, groove 1A may be formed around the entire periphery of the surface of the copper base 11. Module mount opening 50 has a diameter of 5.6 mm assuming fastening with a screw of M5 size, and groove 1A has a width and depth of 1 mm, respectively, as described above.

Further details of this embodiment will be described with reference to FIG. 1. Although it is not shown in FIG. 1, soldering of the metal base 11 with ceramics substrate 14 and printed wiring board 15, and soldering between ceramics substrate 14 and Si chip 16 are provided using the same kind of solder. This solder is an eutectic solder made of Pb 40%-Sn 60%, and is applied approximately to 0.1 mm thickness. In the case where a metal-base inserted molded case is used, and when a plurality of components are to be soldered simultaneously in one step, the melting point of the solder used must be lower than the softening point or melting point (hereinafter referred to as the softening point) of the resin of the molded case. In this embodiment of the invention, the molded case is made of polyphenylene sulfide (PPS), and its softening point is approximately 260° C. Therefore, the melting point of the solder for use in the substrate soldering and chip soldering must be 240° C. or below in consideration of providing a suitable margin. Thereby, Sn 60%-Pb 40% solder having a melting point at 180° C. was used. Use of this solder provides a good adhesion both in the substrate soldering and the chip soldering.

A method of electrical connection for use in this embodiment of the invention will be described in the following. Since an electrical connection between external input/output terminal 12 and Si chip 16 is provided solely by Al wire 19 in this embodiment of the invention, the large stress, which is applied on the ceramics substrate 14 in the prior art of FIG. 2, which uses terminal block 20 and soldering of main terminal 12 to the substrate, and is provided substantially in a vertical direction, is eliminated. As a consequence, the thickness of the substrate of the present invention can be reduced remarkably in comparison with the substantial thickness of the prior art of FIG. 2. An alumina substrate 0.28 mm thick is used as the ceramics substrate 14 in this embodiment, which thickness is less than half of the conventional thickness, and further, there is no need to add zirconia or the like in order to improve toughness of the alumina substrate. Al wire of 300 mm diameter was used in this embodiment to avoid a decrease in chip production yields due to bonding damage.

With reference to FIG. 5, the construction of a module according to this embodiment of the invention will be described. Metal wirings for V and W phases are omitted in order to simplify the description. In the side walls of a module case of approximately 8 cm×9 cm size there are inserted main terminals P, N, U, V and W. The shape of each terminal is a screw fastening type, and a nut of M4 size is inserted by integral molding for each terminal in the wall portions of the case. Terminals P, U, V and W have their respective electrode pads 54, 55, 56 and 57 juxtaposed thereto in the wall portions of the case, while only the main terminal N has its electrode pad 1B juxtaposed thereto across the center portion of the case such that the pad 1B partitions the case in half. This is due to the need for grounding the emitters of the IGBTs 52 and FWDs 53 with metal wiring 58 by connecting them with electrode 1B of main terminal N, and for reinforcing the case construction. When it is desired to mold a relatively large sized module so as to be integral with its copper base as in this embodiment of the invention, there arises a problem of inadequate strength of adhesion when only peripheral portions of the molded case and the metal base are bonded; therefore, a beam 500 for reinforcement is required to be provided across the center portion. Further, a rib 59 provided in each corner of the module serves to reinforce the molded case and increase the adhesion with the base.

In this arrangement of the present embodiment of the invention, alumina substrate 5A and control wiring printed circuit board 5C, both for an upper arm mounted with upper arm elements, and alumina substrate 5B and control wiring printed circuit board 5D, both for a bottom arm mounted with bottom arm elements, are disposed symmetrically with respect to electrode 1B of main terminal N. This symmetrical arrangement provides an effective noise-free construction against electromagnetic interference.

Namely, as indicated in FIG. 5, electrode 1B of main terminal N and a copper foil on the upper arm alumina substrate 5A, which is an electrode of the main terminal P, are juxtaposed in parallel. Therefore, the mutual inductance induced between these two electrodes is very great, being as large as 10 nH. The self inductance of each of the terminals P and N is about 20 nH, however, since a current flows in reverse directions in the electrodes of the main terminals P and N, the above-mentioned mutual inductance acts to decrease the total inductance therein, thereby substantially decreasing the total inductances in the electrodes P and N to levels smaller than the self inductance of 20 nH. Thereby, a surge voltage at switching can be minimized in this module of the invention. The surge voltage measured at switching was about 50 V.

Figure 13:
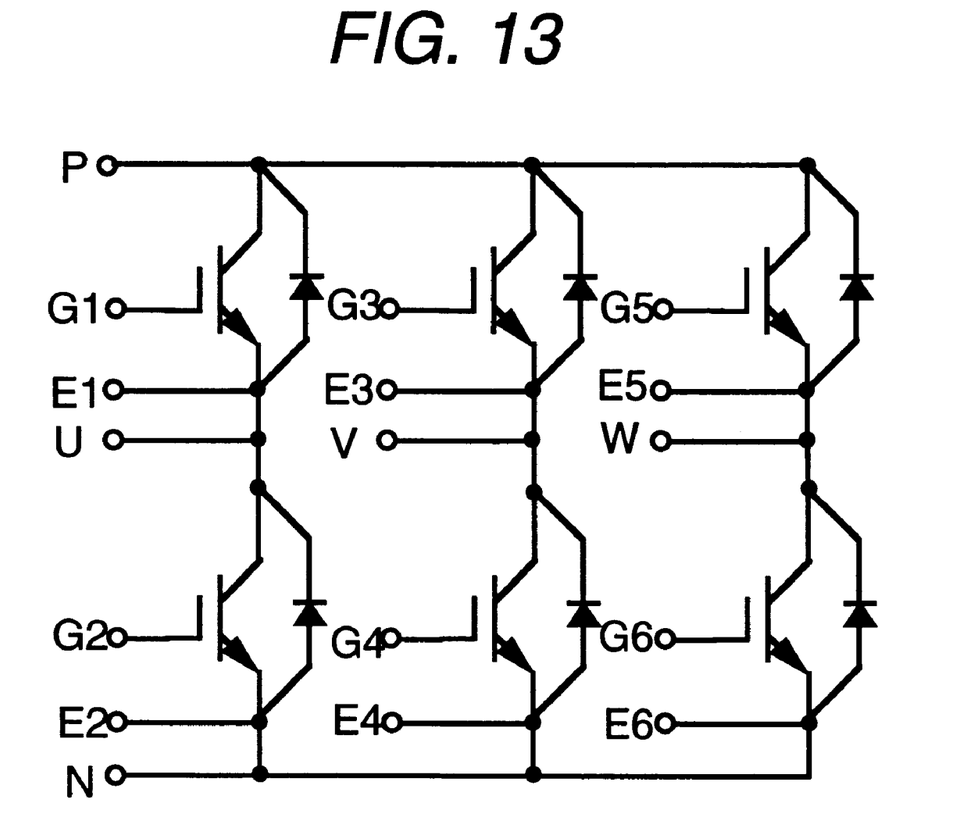
FIG. 13 is an equivalent schematic circuit diagram indicative of various corresponding wiring and terminals of the power semiconductor module according to the embodiment of the invention.

Metal wirings connected to the electrodes U, V and W are disposed substantially perpendicular to the above-mentioned electrodes P and N, as indicated in FIG. 5. This implies that there exists substantially no mutual inductance between the electrodes P, N and the electrodes U, V and W, meaning that electrode wirings of P and N which are supplied with a DC voltage carry no EMI noise, thereby ensuring a stable inverter operation. In addition, since the control wiring printed board 5D and wirings of the electrodes U, V and W, i.e., metal wiring 5E, are disposed perpendicular to each other to prevent a mutual inductance from being induced therebetween, an EMI noise affecting the control signal is minimized. Namely, with reference to FIG. 13, which represents an equivalent circuit of FIG. 5, there is almost no mutual interference induced between respective wirings of G2-E2, G4-E4, G5-E5 and with respect to U, V, W. On the other hand, since control wiring printed circuit board 5C and the P electrode are disposed substantially in parallel, a mutual inductance exists between respective wirings of G1-E1, G3-E3, G5-E5 and of the P electrode wiring. However, since a pair of a gate wiring (G1, G2, G3, G4, G5, G6) and a reference emitter wiring corresponding thereto (E1, E2, E3, E4, E5, E6) are disposed in proximity and substantially in parallel, for example, as indicated by G1-E1, G2-E2 . . . G6-E6, in this embodiment of the invention, even though a noise is superimposed due to mutual inductance, the same noise in the same phase and quantity is superimposed both on the gate wiring and the reference emitter wiring. This implies that a potential difference between the gate and the reference emitter which determines ON and OFF states of IGBTs is immune to EMI noise, thereby, in consequence, eliminating the adverse effect of the noise.

As described above, the module construction according to the first embodiment of the invention has solved the problem of gel leakage associated with the prior art metal base-inserted molded case, has realized an effective screw fastening of the main terminal to the molded case which was not possible in the prior art, and has provided for an electrical wiring pattern which is immune to EMI noise as well.

Embodiment 2

Figure 7A:
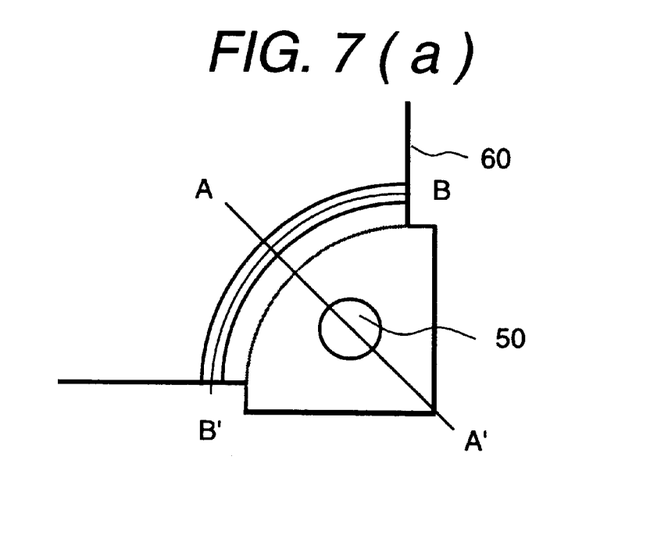
FIG. 7(a) is a diagram indicative of the q copper base in part of the power semiconductor module of the invention.
Figure 7B:
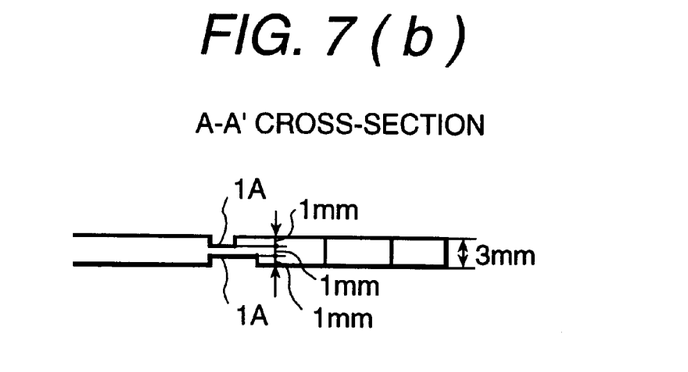
FIG. 7(b) is a cross-sectional view taken along line A–A' in FIG. 7(a)
Figure 7C:
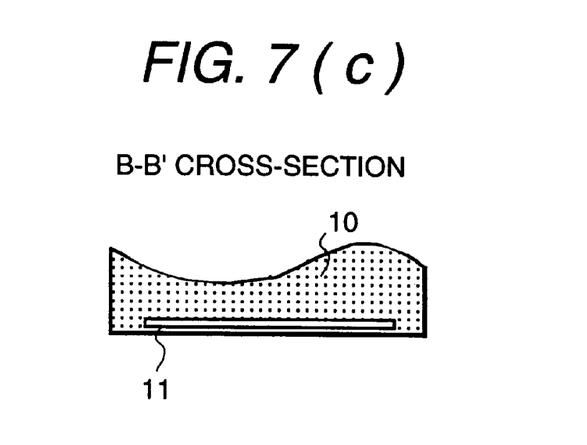
FIG. 7(c) is a cross-sectional view taken along line B–B' in FIG. 7(a)

With reference to FIG. 7(a), a second embodiment of the invention is described in the following, which has the same shape and contour as that of embodiment 1 except that it has a groove 1A in both surfaces of the copper base 11. An enlarged portion of a corner in part of the copper base 11 is shown in FIG. 7(a) and cross-sectional views thereof are illustrated in FIG. 7(b) and 7(c). A reason why a cut-out portion 60 is provided in this embodiment is the same as described with respect to embodiment 1 of the invention. Provision of grooves 1A in both surfaces of the copper base 11 ensures that the copper base 11 will be surrounded and clamped by the case resin from all directions, which arrangement is indicated by the cross-sectional view along line B–B' of FIG. 7(c). Copper base 11 is clamped tightly by the case resin which contracts it when cured, thereby substantially increasing the air-tightness of the molded case as compared to that of FIG. 6(a).

Embodiment 3

Figure 9:
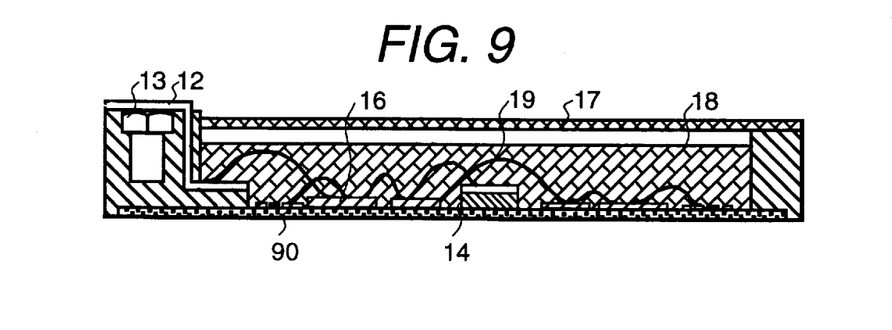
FIG. 9 is a diagram in cross-sectional view of a power semiconductor module according to another embodiment of the invention.

With reference to FIG. 9, a third embodiment of the invention will be described below. Embodiment 3 eliminates use of the metal base, and uses as a module support plate the ceramics substrate 14 alone. An alumina substrate was used as the ceramics substrate 14 in this embodiment. There exists a large difference in thermal expansion coefficients between the alumina substrate and polyphenylene sulfide resin (PPS) used as a case resin, so that the alumina substrate is caused to be clamped tightly in the polyphenylene sulfide resin (PPS) case by contraction when subjected to high temperatures during the conduction state of the power semiconductors or during soldering of the module, thereby substantially increasing the adhesion therebetween. Thereby, a support plate inserted molded case having an air-tightness is provided without adopting the groove formation technique of the embodiment 1 of the invention. A further advantage of embodiment 3 of the invention is that a problem associated with the bending of the copper base due to a difference of thermal expansion coefficients between the alumina substrate and the copper base can be eliminated. In this embodiment 3 of the invention, control wiring is provided by a copper foil pattern 90 on the alumina substrate. Further, the wiring electrode pad for electrode N provided in the case of FIG. 5 can be provided by a copper pattern on the alumina substrate as well. Other features concerning the shape of elements and electric connections are the same as those of embodiment 1 of FIG. 5.

Embodiment 4

Figure 10:
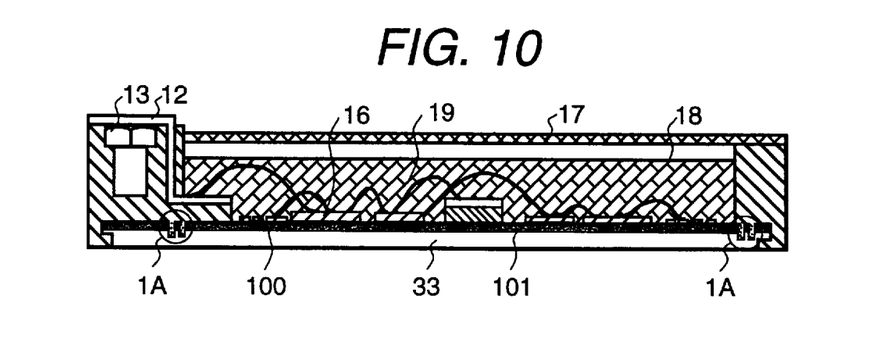
FIG. 10 is a diagram in cross-sectional view of a power semiconductor module according to still another embodiment of the invention.

An embodiment 4 of the invention is illustrated in FIG. 10 in which an A1 metal core printed wiring board 33 is utilized. in this embodiment 4, provision of groove 1A is necessary for the improvement of adhesion similar to embodiment 1. Also, as in embodiment 2 of FIG. 9, a control wiring is provided by a copper foil printed pattern 100 on A1 metal core printed wiring board 33, and an N electrode can be formed by this copper foil printed pattern. Since the control terminal wiring and the main circuit terminal wiring can be inserted in the module case in proximity to the boundary of the bonding between the module case and the substrate according to this embodiment, a module having a substantially reduced size can be realized. In this embodiment 4, since A1 metal core printed wiring board 33 is exposed to a high temperature molten molding resin to be inserted in a molded case at about 280° C., the resin material 101 of the A1 metal core printed wiring board 33 must have a sufficient heat resistance.

Embodiment 5

Figure 11:
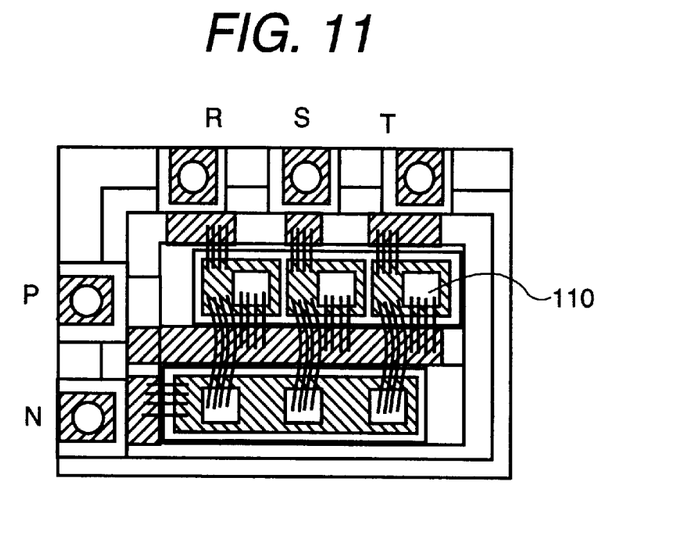
FIG. 11 is a diagram indicative of the layout of a converter in plan view according to one embodiment of the invention.

A converter circuit according to a fifth embodiment of the invention having a three-phase power input is illustrated in FIG. 11. A groove is provided also in the surface of a copper base in this embodiment, the copper base is inserted integrally in a resin mold case, and wirings for outputs P and N and wirings for inputs R, S and T are disposed perpendicular to one another. The converter circuit of the fifth embodiment is provided with rectifying diodes 110, instead of the IGBTs and FWDs provided in the first embodiment of the invention, so that the control terminals required therefor are eliminated. Other parts of the module construction are the same as in the first embodiment.

Figure 12:
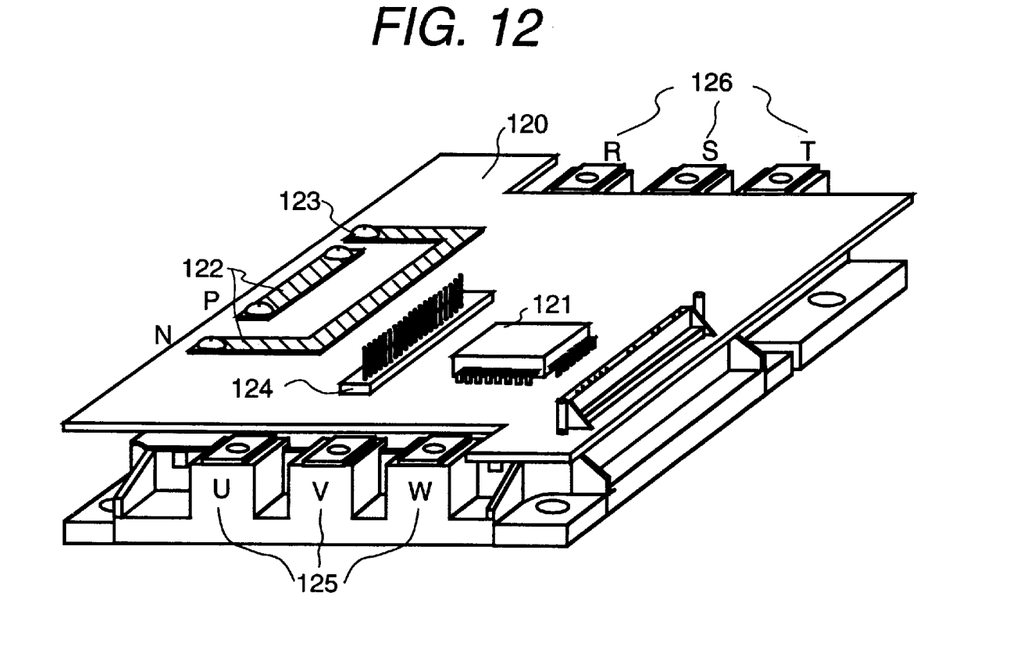
FIG. 12 is a perspective view of a converter and inverter module assembly according to one embodiment of the invention.

With reference to FIG. 12, a further example of this embodiment of the invention is illustrated, in which a power semiconductor module construction of the invention is employed in the manufacture of a three-phase inverter 125 and three-phase converter 126, which are mounted on a printed circuit board 120. P and N electrodes of the three-phase inverter and the three-phase converter are arranged to be inserted in the same side wall of a metal-inserted case, and copper wirings 122 for connecting respective P and respective N electrodes of both the inverter and converter are arranged to be the shortest possible. Further, these copper wirings 122 are fastened with screws 123 as indicated in FIG. 12. Although not shown, electrode terminals U, V, W, R, S and T are also fastened with a screw. Gate drive circuit 121 mounted on printed circuit board 120 is a driver IC for driving the three-phase inverter 125, and control pin array 124 provides terminals for controlling this gate drive circuit 121. A CPU for controlling the gate drive circuit 121 and ICs of operational amplifiers (which are not shown) are mounted on another printed circuit board stacked on printed circuit board 120.

The advantages afforded by the module construction according to the invention include improvements in the reliability of the terminal screws due to an increased terminal fastening strength resulting from elimination of the gap between the inserted nut and the resin case, as well as by the adequate breakdown voltage ensured between the fastening screw and the metal base, and of the increased mechanical strength of the module construction afforded by the metal base, which is inserted integral with the molded case, and the beam which is provided across the center portion of the module.

A further advantage according to the module construction of the invention includes realization of a highly reliable module arrangement capable of preventing leakage of gel or hard resin prior to curing, and the ability to protect the metal wirings and elements from contamination and moisture from the outside through provision of grooves provided in one surface or both surfaces of the metal base.

What is claimed is:

1. A power semiconductor module comprising at least a power circuit unit having power semiconductor elements; a resin case; a metal base which seals a bottom portion of the resin case; an insulation substrate which electrically insulates said metal base from said power circuit unit; external input and output terminals to be connected to said power circuit unit, said external input and output terminals being inserted by integral molding in the body of said resin case; and resin encapsulant material disposed in said resin case, said power semiconductor module further comprising:

a nut for fastening said external input and output terminals with a screw, said nut being molded integral within said resin case; and a recess to receive the end of said screw located immediately below said nut in said resin case, said recess extending without penetrating said resin case, wherein said metal base is inserted within said resin case by integral molding and is arranged to extend to a bottom portion of said recess beneath a part of said resin case, and wherein said external input and output terminals have a portion of a conductor disposed substantially perpendicular relative to said metal base.

2. A power semiconductor module comprising at least a power circuit unit having power semiconductor elements; a resin case; a metal base which seals a bottom portion of the resin case; an insulation substrate which electrically insulates said metal base from said power circuit unit; external input and output terminals to be connected to said power circuit unit, said external input and output terminals being inserted by integral molding in the body of said resin case; and resin encapsulant material disposed in said resin case, said power semiconductor module further comprising:

a nut for fastening said external input and output terminals with a screw, said nut being molded integral within said resin case;

a recess to receive the end of said screw located immediately below said nut in said resin case, said recess extending without penetrating said resin case, wherein said metal base is inserted within said resin case by integral molding and is arranged to extend to a bottom portion of said recess beneath a part of said resin case; and a groove provided in a surface of said metal based on a side of said metal base which is bonded with said resin case.

3. A power semiconductor module comprising at least a power circuit unit having power semiconductor elements; a resin case; a metal base which seals a bottom portion of the resin case; an insulation substrate which electrically insulates said metal base from said power circuit unit; external input and output terminals to be connected to said power circuit unit, said external input and output terminals being inserted by integral molding in the body of said resin case; and resin encapsulant material disposed in said resin case, said power semiconductor module further comprising:

a nut for fastening said external input and output terminals with a screw, said nut being molded integral within said resin case; and a recess to receive the end of said screw located immediately below said nut in said resin case, said recess extending without penetrating said resin case, case, and wherein a groove is provided in both a first side of said metal base having a component mounting surface and on a surface of a second, opposing side thereof.

4. A power semiconductor module according to claim 2, wherein a groove is provided in the form of at least two recessed rows.

5. A power semiconductor module comprising at least a power circuit unit having power semiconductor elements; a resin case; a metal base which seals a bottom portion of the resin case; an insulation substrate which electrically insulates said metal base from said power circuit unit; external input and output terminals to be connected to said power circuit unit, said external input and output terminals being inserted by integral molding in the body of said resin case; and resin encapsulant material disposed in said resin case, said power semiconductor module further comprising:

a nut for fastening said external input and output terminals with a screw, said nut being molded integral within said resin case;

a recess to receive the end of said screw located immediately below said nut in said resin case, said recess extending without penetrating said resin case, wherein said metal base is inserted within said resin case by integral molding and is arranged to extend to a bottom portion of said recess beneath a part of said resin case; and a beam provided as a reinforcement across substantially a center portion and in contact with a surface of said metal base, said beam being made of a resin which is substantially the same as that of said resin case with no seam present between said beam and said resin case.

6. A power semiconductor module according to claim 5, further comprising electrical wiring for connection with an external terminal, formed on a surface of said beam in parallel thereto.

7. A power semiconductor module according to claim 6, wherein said electrical wiring formed on said surface of said beam is a ground wiring.

8. A power semiconductor module according to claim 5, further comprising a control circuit unit for controlling said power circuit unit having the power semiconductor elements, wherein an upper arm portion and a bottom arm portion are arranged substantially symmetrically with respect to said beam, said upper arm portion including an insulation substrate which mounts power semiconductor elements connected between a source voltage wiring and an output wiring, and a printed circuit board for controlling said power semiconductor elements, and said bottom arm portion including an insulation substrate which mounts power semiconductor elements connected between a ground wiring and the output wiring, and a printed circuit board for controlling said power semiconductor elements.

9. A power semiconductor module according to claim 7, wherein source voltage wirings and ground wirings are arranged substantially in parallel, and output wirings are arranged substantially perpendicular to said source voltage wirings and said ground wirings.

10. A power semiconductor module according to claim 9, wherein said output wirings and a printed circuit board portion of said control circuit unit are arranged substantially perpendicular to each other.

11. A power semiconductor module according to claim 10, wherein a gate wiring of said power semiconductor elements and a gate voltage reference potential wiring of said power semiconductor elements are disposed substantially in parallel on said printed circuit board of said control circuit unit.

12. A power semiconductor module having a power circuit unit having power semiconductor elements; a resin case; a metal base for sealing a bottom of the resin case; an insulation substrate for electrically insulating said metal base from said power circuit unit; external input and output terminals to be connected to said power circuit unit, said external input and output terminals being inserted in the body of said resin case by integral molding; and a resin encapsulation material disposed in said resin case, wherein said metal base is inserted in said resin case by integral molding, and at least two rows of grooves are formed in a surface of said metal base to be bonded with said resin case.

13. A power semiconductor module according to claim 12, wherein soldering between said power elements and said insulation substrate, and soldering between said insulation substrate and said metal base are provided using a solder having a melting point which is lower than a softening point of a resin which constitutes said resin case.

* * * * *